(12) United States Patent
Yamamoto (10) Patent No.: US 8,990,741 B2
(45) Date of Patent: Mar. 24, 2015

(54) CIRCUIT DESIGN SUPPORT DEVICE, CIRCUIT DESIGN SUPPORT METHOD AND PROGRAM

(71) Applicant: Ryo Yamamoto, Chiyoda-ku (JP)

(72) Inventor: Ryo Yamamoto, Chiyoda-ku (JP)

(73) Assignee: Mitsubishi Electric Corporation, Tokyo (JM)

( * ) Notice: Subject to any disclaimer, the term of this patent is extended or adjusted under 35 U.S.C. 154(b) by 0 days.

(21) Appl. No.: 13/850,421

(22) Filed: Mar. 26, 2013

(65) Prior Publication Data

US 2013/0305198 A1 Nov. 14, 2013

(30) Foreign Application Priority Data

May 10, 2012 (JP) ................................. 2012-108308

(51) Int. Cl.
*G06F 17/50* (2006.01)

(52) U.S. Cl.
CPC .................................. *G06F 17/505* (2013.01)
USPC ......................................... 716/104; 716/101

(58) Field of Classification Search
CPC .......... G06F 11/3636; G06F 17/30471; G06F 11/3409; G06F 9/30043
USPC ........................................................ 716/104
See application file for complete search history.

(56) References Cited

U.S. PATENT DOCUMENTS

| | | | |
|---|---|---|---|
| 6,532,584 B1 | 3/2003 | Nishida et al. | |
| 2003/0028854 A1* | 2/2003 | Nishida et al. | 716/18 |
| 2004/0024993 A1* | 2/2004 | Parthasarathy | 712/218 |
| 2005/0125762 A1 | 6/2005 | Hattori et al. | |
| 2005/0268271 A1 | 12/2005 | Gutberlet et al. | |
| 2005/0273752 A1 | 12/2005 | Gutberlet et al. | |
| 2006/0288337 A1 | 12/2006 | Nishi | |
| 2007/0234267 A1 | 10/2007 | Kakui | |

(Continued)

FOREIGN PATENT DOCUMENTS

| | | |
|---|---|---|
| JP | 8-44773 | 2/1996 |
| JP | 11-184895 | 7/1999 |
| JP | 2001-209664 | 8/2001 |

(Continued)

OTHER PUBLICATIONS

Lai et al, "A Read-Write Aware DRAM Scheduling for Power Reduction in Multi-Core Systems", Jan. 20-23, 2014, Design Automation Conference (ASP-DAC), 2014 19th Asia and South Pacific, pp. 604-609.*

*Primary Examiner* — Paul Dinh
*Assistant Examiner* — Bryce Aisaka
(74) *Attorney, Agent, or Firm* — Oblon, Spivak, McClelland, Maier & Neustadt, L.L.P.

(57) ABSTRACT

A processing part inputs a behavior description code in which a write access array to be accessed to write and a read access array to be accessed to read are used. The processing part analyzes the behavior description code, and determines an order of using each write access address and an order of using each read access address when the behavior description code is executed. Further, the processing part performs either one of a write access order changing process to change the order of using the write access addresses when the behavior description code is executed based on the order of using the read access addresses and a read access order changing process to change the order of using the read access addresses when the behavior description code is executed based on the order of using the write access addresses.

14 Claims, 9 Drawing Sheets

(56) References Cited

U.S. PATENT DOCUMENTS

| | | |
|---|---|---|
| 2007/0250303 A1 | 10/2007 | Imai et al. |
| 2008/0148215 A1 | 6/2008 | Gutberlet et al. |

FOREIGN PATENT DOCUMENTS

| | | |
|---|---|---|
| JP | 2002-269162 | 9/2002 |
| JP | 2004-54641 | 2/2004 |
| JP | 2005-173648 | 6/2005 |
| JP | 2005-189939 | 7/2005 |
| JP | 2006-350849 | 12/2006 |
| JP | 2007-272797 | 10/2007 |
| JP | 2007-287044 | 11/2007 |
| JP | 2008-501185 | 1/2008 |
| JP | 2010-238054 | 10/2010 |

* cited by examiner

```
for ( int i = 0; i < N; i++){
tmp = mem[i] + c;
if(count != 10){
  dat[i] = tmp;
}
if(tmp > 0 ){
  count++;
  }
}
for( int i= 0; i< N/2;i++){
  out[i] = dat[i] + dat[N-i];
}
```

Fig. 4

LOOP TABLE

| LOOP ID | NUMBER OF LINES |
|---------|-----------------|
| 1       | 10              |
| 2       | 20              |

Fig. 5

ARRAY TABLE

| ARRAY ID | LOOP ID | NAME OF ARRAY | R/W | LOOP STEP | NO. OF ACCESSES | TOTAL NO. OF ACCESSES |
|---|---|---|---|---|---|---|
| 1 | 1 | mem | R | 1 | 1 | N |
| 2 | 1 | dat | W | 1 | 1 | N |
| 2 | 2 | dat | R | 1 | 2 | N |
| 3 | 2 | out | W | 1 | 1 | N/2 |

Fig. 6

LOOP TABLE (AFTER DETERMINING DEPENDENCY)

| LOOP ID | NUMBER OF LINES | DEPENDENCY |
|---|---|---|
| 1 | 10 | PRESENT |
| 2 | 20 | ABSENT |

Fig. 7

ACCESS DELAY TABLE

| CYCLE # | WRITE ACCESS ADDRESS | READ 1 ACCESS ADDRESS | READ 2 ACCESS ADDRESS | ACCESS DELAY | ACCESS COST |
|---|---|---|---|---|---|
| 1 | 0 | 0 |  | 1 | 16 |
| 2 | 1 |  | 15 | 16 |  |
| 3 | 2 | 1 |  | 2 | 15 (17) |
| 4 | 3 |  | 14 | 15 |  |
| 5 | 4 | 2 |  | 3 | 14 (18) |
| 6 | 5 |  | 13 | 14 |  |
| 7 | 6 | 3 |  | 4 | 13 (19) |
| 8 | 7 |  | 12 | 13 |  |
| 9 | 8 | 4 |  | 5 | 12 (20) |
| 10 | 9 |  | 11 | 12 |  |
| 11 | 10 | 5 |  | 6 | 11 (21) |
| 12 | 11 |  | 10 | 11 |  |
| 13 | 12 | 6 |  | 7 | 10 (22) |
| 14 | 13 |  | 9 | 10 |  |
| 15 | 14 | 7 |  | 8 | 9 (23) |
| 16 | 15 |  | 8 | 9 |  |

Fig. 8

```
for( int i = 0; i < N-1; i++){
  dat[i] = mem[i]....;
}
.....
// FIXED READ OPTION
for( int i= 0; i< N/2;i++){
  out[i] = dat[i] + dat[N-i];
}
```

Fig. 9

ACCESS DELAY TABLE (ACCESS CASE 2)

| CYCLE # | WRITE ACCESS ADDRESS | READ 1 ACCESS ADDRESS | READ 2 ACCESS ADDRESS | ACCESS DELAY | ACCESS COST | CHANGED WRITE ACCESS | CHANGED ACCESS COST |
|---|---|---|---|---|---|---|---|
| 1 | 0 | 0 |  | 1 | 16 | 0 | 0 |
| 2 | 1 |  | 15 | 16 |  | 15 |  |
| 3 | 2 | 1 |  | 2 | 15 | 1 | 0 |
| 4 | 3 |  | 14 | 15 |  | 14 |  |
| 5 | 4 | 2 |  | 3 | 14 | 2 | 0 |
| 6 | 5 |  | 13 | 14 |  | 13 |  |
| 7 | 6 | 3 |  | 4 | 13 | 3 | 0 |
| 8 | 7 |  | 12 | 13 |  | 12 |  |
| 9 | 8 | 4 |  | 5 | 12 | 4 | 0 |
| 10 | 9 |  | 11 | 12 |  | 11 |  |
| 11 | 10 | 5 |  | 6 | 11 | 5 | 0 |
| 12 | 11 |  | 10 | 11 |  | 10 |  |
| 13 | 12 | 6 |  | 7 | 10 | 6 | 0 |
| 14 | 13 |  | 9 | 10 |  | 9 |  |
| 15 | 14 | 7 |  | 8 | 9 | 7 | 0 |
| 16 | 15 |  | 8 | 9 |  | 8 |  |

Fig. 10

ACCESS DELAY TABLE
(ACCESS CASE 4)

| CYCLE # | WRITE ACCESS ADDRESS | READ 1 ACCESS ADDRESS | READ 2 ACCESS ADDRESS | ACCESS DELAY | ACCESS COST | CHANGED READ 1 ACCESS ADDRESS | CHANGED READ 2 ACCESS ADDRESS | UPDATED ACCESS DELAY | UPDATED ACCESS COST |
|---|---|---|---|---|---|---|---|---|---|
| 1 | 0 | 0 |  | 1 | 16 | 7 |  | 8 | 9 |
| 2 | 1 |  | 15 | 16 |  |  | 8 | 9 |  |
| 3 | 2 | 1 |  | 2 | 15 | 6 |  | 7 | 10 |
| 4 | 3 |  | 14 | 15 |  |  | 9 | 10 |  |
| 5 | 4 | 2 |  | 3 | 14 | 5 |  | 6 | 11 |
| 6 | 5 |  | 13 | 14 |  |  | 10 | 11 |  |
| 7 | 6 | 3 |  | 4 | 13 | 4 |  | 5 | 12 |
| 8 | 7 |  | 12 | 13 |  |  | 11 | 12 |  |
| 9 | 8 | 4 |  | 5 | 12 | 3 |  | 4 | 13 |
| 10 | 9 |  | 11 | 12 |  |  | 12 | 13 |  |
| 11 | 10 | 5 |  | 6 | 11 | 2 |  | 3 | 14 |
| 12 | 11 |  | 10 | 11 |  |  | 13 | 14 |  |
| 13 | 12 | 6 |  | 7 | 10 | 1 |  | 2 | 15 |
| 14 | 13 |  | 9 | 10 |  |  | 14 | 15 |  |
| 15 | 14 | 7 |  | 8 | 9 | 0 |  | 1 | 16 |
| 16 | 15 |  | 8 | 9 |  |  | 15 | 16 |  |

CIRCUIT DESIGN SUPPORT DEVICE, CIRCUIT DESIGN SUPPORT METHOD AND PROGRAM

CROSS-REFERENCE TO RELATED APPLICATIONS

This application is based on and claims the benefit of priority from Japanese Patent Application No. 2012-108308, filed in Japan on May 10, 2012, the content of which is incorporated herein by reference in its entirety.

TECHNICAL FIELD

The present invention relates to a circuit design support device which supports circuit design.

More specifically, the present invention relates to a circuit design support device which supports semiconductor design employing high level synthesis (behavior synthesis) which automatically generates register transfer level from behavior description code (also called simply as "behavior description", hereinafter).

BACKGROUND ART

In a conventional semiconductor integrated circuit design, the register transfer level (RTL) which describes behaviors of registers and combined circuits between registers included in a circuit is designed using hardware description language.

The circuit scale of the integrated circuit has been increased in recent years, which takes large amount of time to design RTL, resulting in a problem.

Then, a high level synthesis technique which generates automatically RTL using C language, C++ language, System C language, and so on that are high level language of which the level of abstraction is higher than RTL are proposed, and a high level synthesis tool implementing the same is commercially available.

Patent Literature 1 discloses that, as a pre-processing of input to the high level synthesis tool, in order to eliminate redundant memories, array description part which may cause generation of redundant memories is detected, and the array is automatically deleted, thereby obtaining an integrated circuit with a small circuit scale.

CITATION LIST

Patent Literature

Patent Literature 1: JP 2010-238054A

SUMMARY OF INVENTION

Technical Problem

However, according to Patent Literature 1, only an array in which an index is expressed by only a loop variable is to be deleted, and thus there still exists a problem that the undeleted array requires memories for elements of the array.

Main object of the present invention is to solve the above problem; the invention aims to effectively eliminate redundant buffers.

Solution to Problem

According to the present invention, circuit design support device includes: a code inputting unit that inputs a behavior description code which describe behavior of a circuit which is a target of high level synthesis using a write access array to be accessed to write and a read access array to be accessed to read; an access order determining unit that analyzes the behavior description code, and determines an order of using each write access address when the behavior description code is executed and an order of using each read access address when the behavior description code is executed; and an access order changing unit that performs either one of a write access order changing process to change the order of using the write access addresses when the behavior description code is executed based on the order of using the read access addresses determined by the access order determining unit and a read access order changing process to change the order of using the read access addresses when the behavior description code is executed based on the order of using the write access addresses determined by the access order determining unit.

Advantageous Effects of Invention

According to the present invention, an order of using write access addresses or an order of using read access addresses is changed, and the order of write accesses can be matched with the order of read accesses, thereby reducing the buffer.

BRIEF DESCRIPTION OF DRAWINGS

The present invention will become fully understood from the detailed description given hereinafter in conjunction with the accompanying drawings, in which.

DESCRIPTION OF EMBODIMENTS

In describing preferred embodiments illustrated in the drawings, specific terminology is employed for the sake of clarity. However, the disclosure of the present invention is not intended to be limited to the specific terminology so selected, and it is to be understood that each specific element includes all technical equivalents that operate in a similar manner and achieve a similar result.

Embodiment 1

The present embodiment explains a semiconductor design support device which obtains a code which is capable to reduce the number of memories or registers located between circuits and to output an operation result with low latency.

More specifically, the semiconductor design support device extracts a dependency between operations and changes an order of operations.

Then, according to the semiconductor design support device related to the present embodiment, it is possible to obtain a hardware configuration (architecture) with high performance and small-circuit scale in a short time, independently from a capability of a designer.

Figure 1:
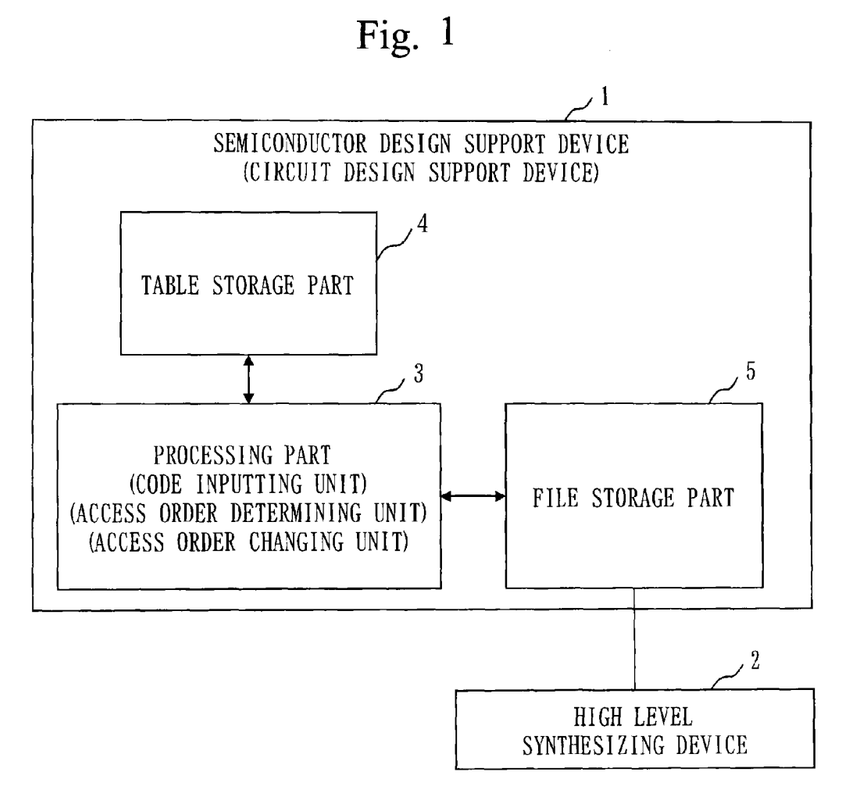
FIG. 1 shows a configuration example of a semiconductor design support device related to the first embodiment.

FIG. 1 is a block diagram showing a configuration of a high level synthesis system employing a semiconductor design support device according to the first embodiment.

In FIG. 1, a semiconductor design support device 1 includes a processing part 3, a table storage part 4, and a file storage part 5.

The semiconductor design support device 1 corresponds to a circuit design support device.

A high level synthesis device 2 receives a behavior description code and generates RTL.

The semiconductor design support device 1 provides the behavior description code on which high level synthesis can be done to the high level synthesizing device 2, thereby obtaining targeted RTL.

A processing part 3 inputs the behavior description code written in the high level language which is a target of high level synthesis, detects access dependency of array, and changes an order of access to the arrays so that the device should be with low delay and a small circuit scale.

The processing part 3 corresponds to a code inputting unit, an access order determining unit, and an access order changing unit.

A table storage part 4 stores tables showing processed result of the processing part 3 and tables to which the processing part 3 refers.

A file storage part 5 stores the behavior description code inputted by the processing part 3.

Further, the file storage part 5 may also store the behavior description code after the processing part 3 changes the behavior description code.

Next, operation of the first embodiment will be explained.

Figure 2:
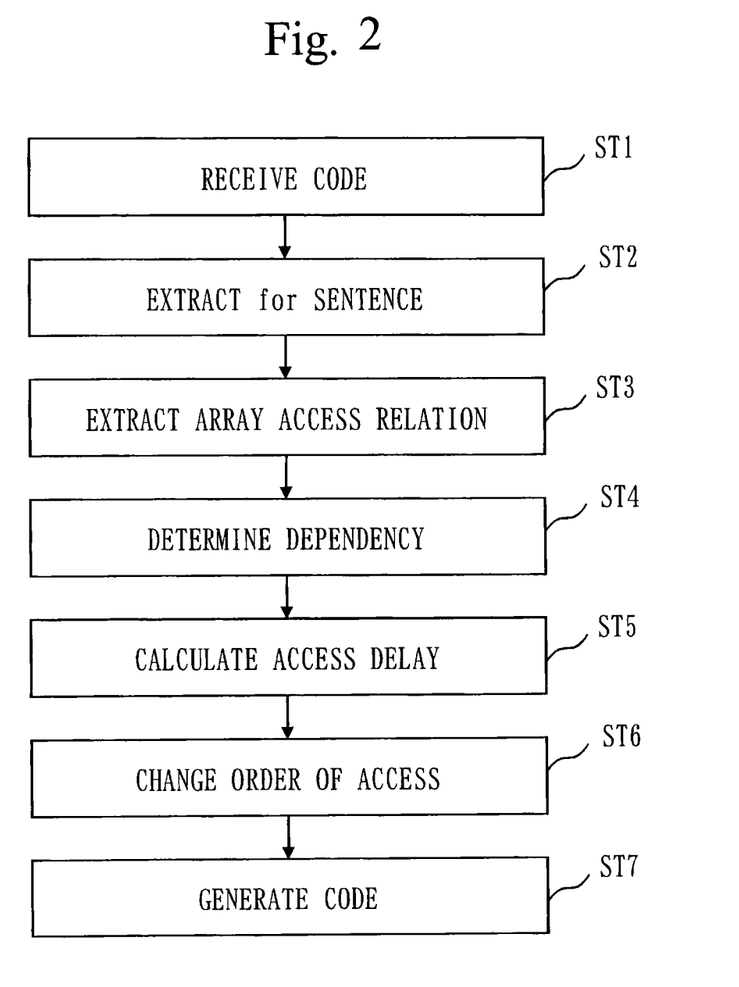
FIG. 2 is a flowchart showing an operation example of a processing part related to the first embodiment.

FIG. 2 is a flowchart showing a flow of operation of the semiconductor design support device 1 according to the first embodiment.

The function of the flowchart is implemented by the processing part 3, and data are exchanged between the table storage part 4 and the file storage part 5 when necessary.

Figure 3:
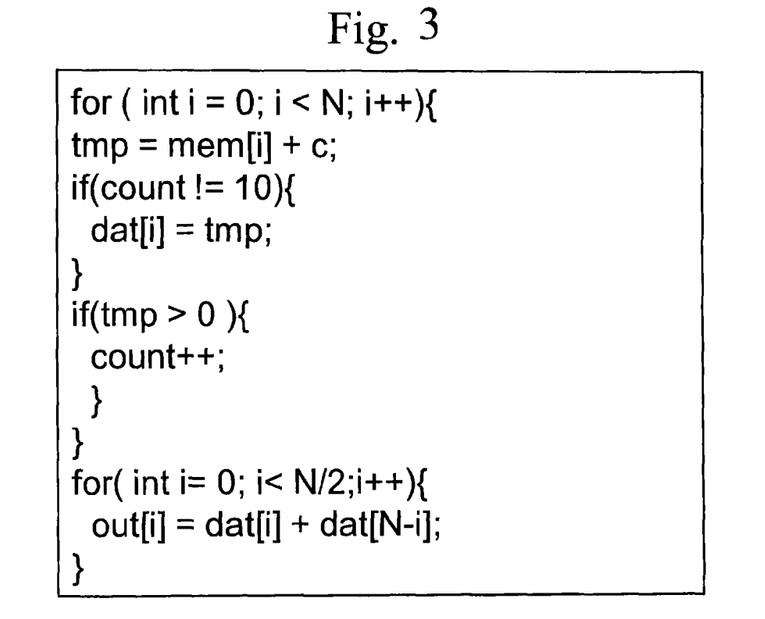
FIG. 3 shows an example of code written in a high level language related to the first embodiment.

Behavior description code that is shown in FIG. 3 as an example will be used for explaining the operation.

Here, the code shown in FIG. 3, which is incomplete as behavior description code, is a part of the behavior description code extracted for explaining the operation related to the present embodiment.

When the description is inputted directly to the high level synthesizing device 2, N buffers (memories or registers) are required between the first loop and the next loop for storing N pieces of data.

There is a problem that it takes time to output the result "out", since the processing cannot be moved from the first loop to the next loop unless the processing on the first loop has been finished.

First, when the semiconductor design support device 1 starts the operation, the processing part 3 receives a file of the behavior description which is a target of high level synthesis, the behavior description is the code shown in FIG. 3 in the current example (at step ST1: RECEIVE CODE) and stores the file in the file storage part 5.

Next, the processing part 3 reads out the code stored in the file storage part 5 (FIG. 3) and extracts "for" sentence (at step ST2: EXTRACT for SENTENCE).

Figure 4:
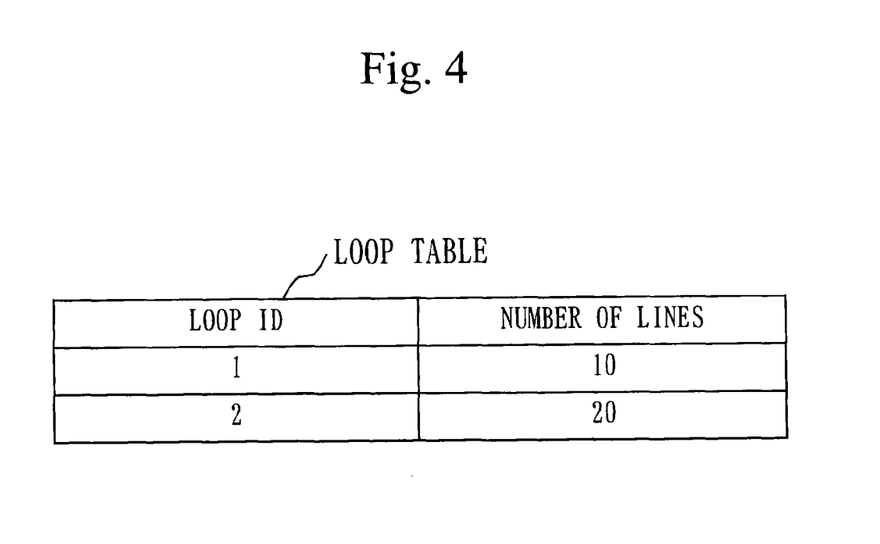
FIG. 4 shows an example of a loop table related to the first embodiment.

This extraction is made by writing a loop ID (Identifier) and its description part (the number of lines) for each "for" sentence in the table storage part 4 as shown in FIG. 4.

The table of FIG. 4 is referred to as a loop table.

Next, the processing part 3 analyzes the behavior description code (FIG. 3) based on the loop table (FIG. 4), extracts a name of array, an array ID, an accessing method, the number of accesses, the total number of accesses in the loop for each loop ID, and writes them in the table storage part 4 (at step ST3: EXTRACT ARRAY ACCESS RELATION).

Here the table in which the above data are written is referred to as an array table.

The name of array is an array variable name described in the code.

As the accessing method, "write" is set if the corresponding array is in the left-hand side in the statement, and "read" is set if the corresponding array is in the right-hand side.

The number of accesses shows how many times the corresponding array has been accessed.

The number of accesses is the number of accesses for each of repeated times.

In case of the code in FIG. 3, since two times of read accesses occur to "dat" variable (dat[i] and dat[N−1]), the number of accesses here is 2.

The total number of accesses shows how many times the corresponding array has been accessed during "for" loop.

Figure 5:
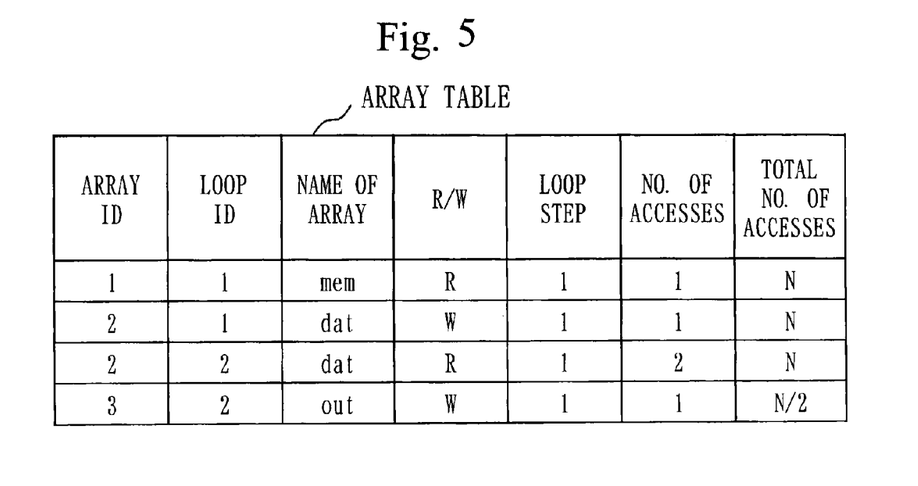
FIG. 5 shows an example of an array table related to the first embodiment.

FIG. 5 shows the result of extracting the array access relation from the code in FIG. 3.

Here, the array of the write access is also called as a write access array; the array of the read access as a read access array.

In FIG. 5, "dat" in the second line and "out" in the fourth line show the write access arrays, and "mem" in the first line and "dat" in the third line show the read access arrays.

Further, an element of array in the write access array is also called as a write access address, and an element of array in the read access array is also called as a read access address.

The write access address shows an address to be accessed by each write access, and the read access address shows an address to be accessed by each read access.

In the code in FIG. 3, the value of each i in dat[i] of the first "for" sentence is the write access address.

Similarly, the value of each i in dat[i] of the second "for" sentence is the read access address.

Next, it is checked if a preceding iteration affects the next iteration in repetition sentence ("for" sentence), for each loop ID in the loop tables generated at step ST1 (at step ST4: DETERMINE DEPENDENCY).

Specifically, after an arbitrary variable in the repetition sentence is referred, if assignment is done in the variable, dependency is determined to be present, and if not, absent.

In case of the code in FIG. 3, in the first "for" sentence, after the variable "count" is referred (count!=10), assignment (count++) is done, and thus dependency is present in the first "for" sentence.

On the other hand, in the second "for" sentence, there is no variable like this, and thus dependency is absent in the second "for" sentence.

Here, if an order of using the write access addresses or the read access addresses included in the "for" sentence having dependency is changed, an operation of a circuit which is a target of high level synthesis may change.

Therefore, the order of using the write access addresses or the read access addresses included in the "for" sentence having dependency cannot be changed.

On the other hand, if an order of using the write access addresses or the read access addresses included in the "for" sentence without dependency is changed, the operation of the circuit which is the target of high level synthesis does not change.

Therefore, the order of using the write access addresses or the read access addresses included in the "for" sentence without dependency can be changed.

The presence or the absence of dependency that is extracted at the step ST4 is added to a loop table in the table storage part 4.

Figure 6:
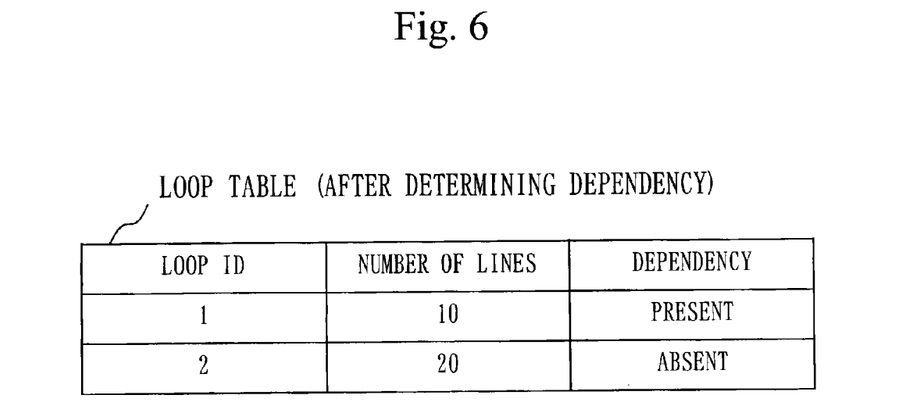
FIG. 6 shows an example of a loop table (after determining dependency) related to the first embodiment.

FIG. 6 shows the loop table after the presence or the absence of dependency is added.

Here, in the behavior description code, there is a case in which an order of execution is desired to be decided beforehand as processing.

For example, image data may be inputted in an order of coordinates.

Therefore, information showing that an order of processing is unchangeable may be added to the behavior description code, or as an option, the processing part 3 may analyze it and may generate dependency information.

Figure 8:
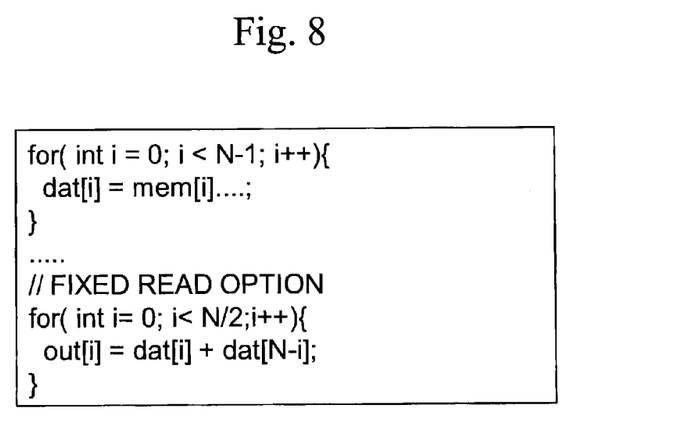
FIG. 8 shows another example of code written in a high level language related to the first embodiment.

FIG. 8 shows an example of the behavior description code in which an order of read cannot be changed.

Here, the behavior description code in FIG. 8 will be discussed later.

Next, the processing part 3 refers to the array table (FIG. 5), carries out address (index) calculation to access the same array ID, and generates an access delay table. The access delay table generated is stored in the table storage part 4 (at step ST5: CALCULATE ACCESS DELAY).

More specifically, the processing part 3 extracts the write access array and the read access array having a common name, makes pairs of the write access array and the read access array having the common name, for each pair of the write access array and the read access array, an order of using the write access address at the time of executing the behavior description code and an order of using the read access address at the time of executing the behavior description code are determined.

In the example of FIG. 5, the write access array and the read access array having the common name of "dat" are paired, an order of using the write access address of "dat" (W: the $2^{nd}$ line) and an order of using the read access address of "dat" (R: the $3^{rd}$ line) are determined.

Figure 7:
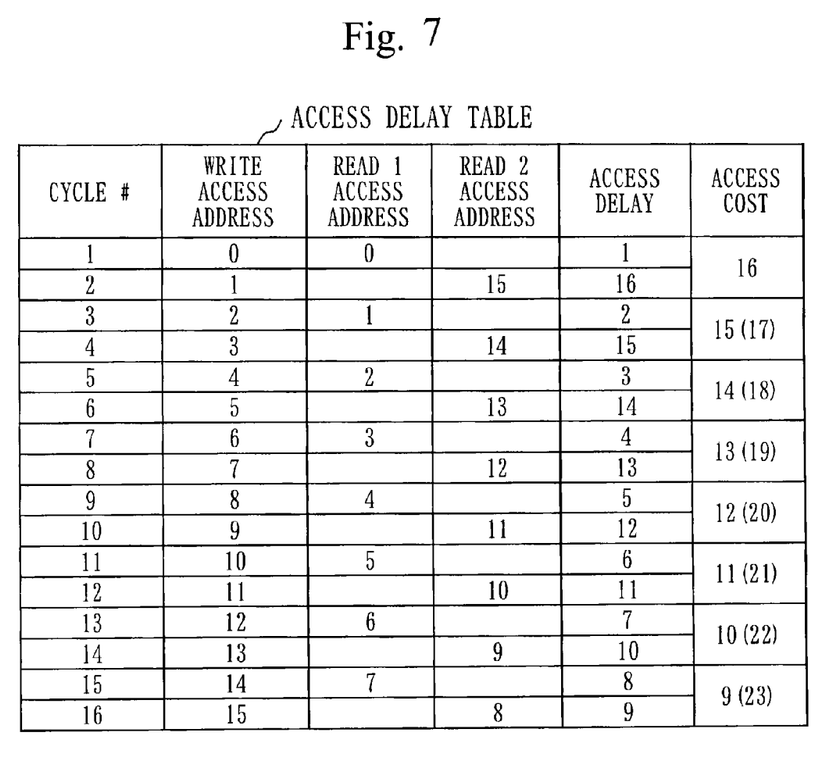
FIG. 7 shows an example of an access delay table related to the first embodiment.

FIG. 7 shows an access delay table obtained by analyzing the code of FIG. 3.

In the access delay table, a cycle number, a write access address, a read access address, an access delay, and an access cost are written.

The cycle number is time information; the cycle number is described by incrementing a cycle such as the $1^{st}$ cycle, the $2^{nd}$ cycle, and so on.

The upper limit is the number of total accesses to the loop.

The write access address is an index of the array for write access obtained by developing the loop.

The numerals shown in the columns of the write access address respectively represent write access addresses; an order of using the write access addresses when the behavior description code is executed is written in the columns of the write access address.

The read access address is provided for each array to be accessed by the read access.

In case of the code example in FIG. 3, two read access (dat[i] and dat[N-i]) occur, and two columns of read access address are set.

The read access address is an index of the array for read access obtained by developing the loop.

The numerals shown in the columns of the read access address respectively show read access addresses; an order of using the read access addresses when the behavior description code is executed is written in the columns of the read access address.

Here, as for read limitation, when it is possible to read two pieces of data at one cycle, such limitation can be given to the processing part 3 as additional information.

The access delay shows relation between the cycle number of the write access address and the cycle number of read access address which have the common address values.

For example, the write access address 6 occurs in the cycle 7, and on the other hand, the corresponding read access address 6 occurs in the cycle 13.

The access delay of the read access address 6 is "7", which is the cycle number of the corresponding write access address 6.

Further, for example, the read access address 15 occurs in the cycle 2, and on the other hand, the corresponding write access address 15 occurs in the cycle 16.

The access delay of the read access address 15 becomes "16" which is the cycle number of the corresponding write access address 15.

As for the access cost, if there are a plurality of reads, the value of the largest access delay is set to the access cost.

In the code of FIG. 3, in the $16^{th}$ cycle, both values of the read access address 0 and the read access address 15 are available, and it is possible to execute out[0]=dat[0]+dat[15-0] in the loop ID 2.

Since the read access address 1 and the read access address 14 occur after the read access address 15, in the $17^{th}$ cycle, out[1]=dat[1]+dat[15-1] in the loop ID 2 can be executed for the read access address 1 and the read access address 14.

The read access address 2 and the read access address 13 occur further after one cycle, so that in the $18^{th}$ cycle, out[2]=dat[2]+dat[15-2] in the loop ID 2 can be executed for the read access address 2 and the read access address 13.

In this manner, in the columns of the access cost of FIG. 7, the cycle number in which out[i]=dat[i]+dat[15-i] in the loop ID 2 can be executed is written in parentheses for each of i=0, 1, 2, 3 . . . .

As shown in FIG. 7, 23 cycles are required for finishing the processing of the loop ID 2 of FIG. 3.

For example, as for the read access address 1 and the read access address 14, when the cycle number is 2, the write of the write access address 1 is done, and when the cycle number is 15, the write of the write access address 14 is done.

On the other hand, the processing of out[1]=dat[1]+dat[15-1] in the loop ID 2 is executed in the $17^{th}$ cycle, so that the value of the write access address 1 should be retained in the buffer from the cycle number 2 to the cycle number 17, and the value of the write access address 14 should be retained in the buffer from the cycle number 15 to the cycle number 17 in order to absorb the timing difference between the write timing and the read timing.

Similarly, the value of the write access address 2 should be retained in the buffer from the cycle number 3 to the cycle number 18, and the value of the write access address 13 should be retained in the buffer from the cycle number 14 to the cycle number 18.

The same can be said for other address values, 16 buffers in total are required for retaining the written values for the read access address 0 to 15.

In this manner, when the code of FIG. 3 is executed, since the order of the write access and the order of the read access are not matched, it is necessary to generate 16 buffers in the high level synthesis.

In the semiconductor design support device 1 according to the present embodiment, such mismatch of the order of using the write access and the order of using the read access can be suppressed.

Next, the processing part 3 changes the order of the write access or the read access (at step ST6: CHANGE ORDER OF ACCESS).

More specifically, the processing part 3 refers to the loop table (FIG. 6) and the array table (FIG. 5), and determines which of the following four cases the behavior description code corresponds to:

Access Case 1: "write dependency: present" and "read dependency: present"

Access Case 2: "write dependency: absent" and "read dependency: present"

Access Case 3: "write dependency: absent" and "read dependency: absent"

Access Case 4: "write dependency: present" and "read dependency: absent"

Here, "write dependency: present" means if the order of using the write access addresses is changed, an operation of a circuit which is a target of high level synthesis changes, so that the order of using the write access addresses cannot be changed.

On the other hand, "write dependency: absent" means even if the order of using the write access addresses is changed, the operation of the circuit which is the target of high level synthesis does not change, so that the order of using the write access addresses can be changed.

Further, "read dependency: present" means if the order of using the read access addresses is changed, the operation of the circuit which is the target of high level synthesis changes, so that the order of using the read access addresses cannot be changed.

On the other hand, "read dependency: absent" means even if the order of using the read access addresses is changed, the operation of the circuit which is the target of high level synthesis does not change, so that the order of using the read access addresses can be changed.

In case of Access Case 1, since the orders of the write access and the read access should be fixed, the performance cannot be improved by the present embodiment, and the process terminates here.

In case of Access Case 2, since the order of the write access can be changed, the order of the write access can be changed according to the order of the read access.

Here, the processing to change the order of the write access to conform to the order of the read access is called as a write access order changing process.

In case of Access Case 3, since both have no dependency, one of the order of the write access and the read access is fixed, and the other is changed.

To determine which of the orders of the write access and the read access to be fixed, whichever the access cost is smaller can be chosen.

In case of Access Case 4, since the order of the read access is changeable, the order of the read access can be changed according to the order of the write access.

Here, the processing to change the order of the read access to conform to the order of the write access is called as a read access order changing process.

Here, Access Case 2 will be explained.

FIG. 8 shows an example of code without write dependency and with read dependency.

The write access array dat[i] of the first loop of FIG. 8 has no dependency.

On the other hand, a read fixed option is given to the second loop.

This is an option to be given when the loop sentence itself has no dependency, but a design requires to execute the processing in an order as shown in the code such as 0, 1, 2, 3 . . . for "out" array.

The processing part 3 analyzes this option, and it is determined at the dependency determination, the dependency exists in the corresponding loop ID ("read dependency" is present in the second loop).

As discussed above, since there is no dependency in the write side (the first loop), the write access can be started from any i of "for" sentence.

Namely, the write access is implemented in the order requested by dat (read access array) of the read side (the second loop), and the result of the write access is transferred to dat of the read side, thereby improving the processing speed.

In this manner, in case of Access Case 2, the processing part 3 writes the changed write access addresses in the access delay table so as to implement the write in the order of read accesses.

Figure 9:
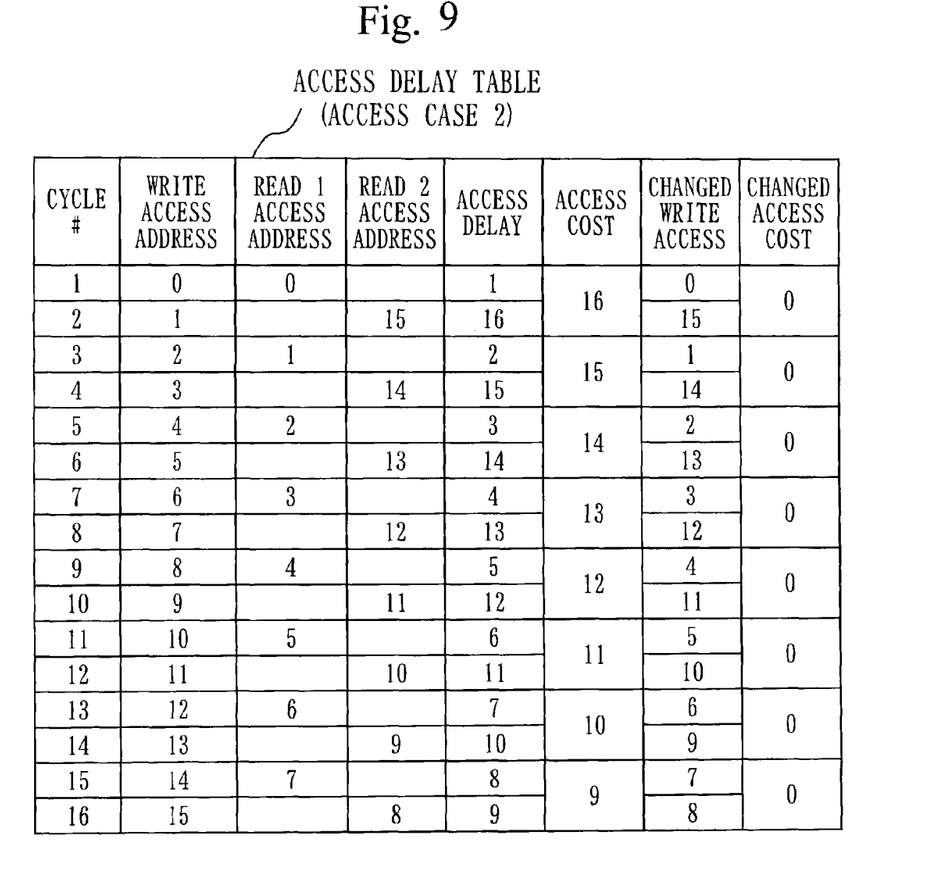
FIG. 9 shows an example of an access delay table (write-dependency: absent, read-dependency: present) related to the first embodiment.

FIG. 9 shows a delay table to which the changed write access address and the updated access cost are added in accordance with the code of FIG. 8.

Here, the contents of the second loop of the code of FIG. 8 is the same as the one of the second loop of FIG. 3, and in case of the code of FIG. 8, the access delay table before changing the order of write access (the access delay table after calculating access delay at ST5 of FIG. 2) is the same as the one shown in FIG. 7.

In the access delay table of FIG. 9, the order of write access addresses is changed so as to match the order of read access addresses (the write access order changing process).

Here, since the delay cost is 0, no buffer is necessary between the first loop and the second loop of FIG. 8, and the result of the first loop can be received directly by the second loop.

When the order of write accesses is changed as shown in FIG. 9, the read from the read access address i occurs directly after the write to the write access address i, and thus the processing is finished by 16 cycles.

Further, as discussed above, since there is no timing difference between the write access and the read access, no buffer is necessary.

Figure 11:
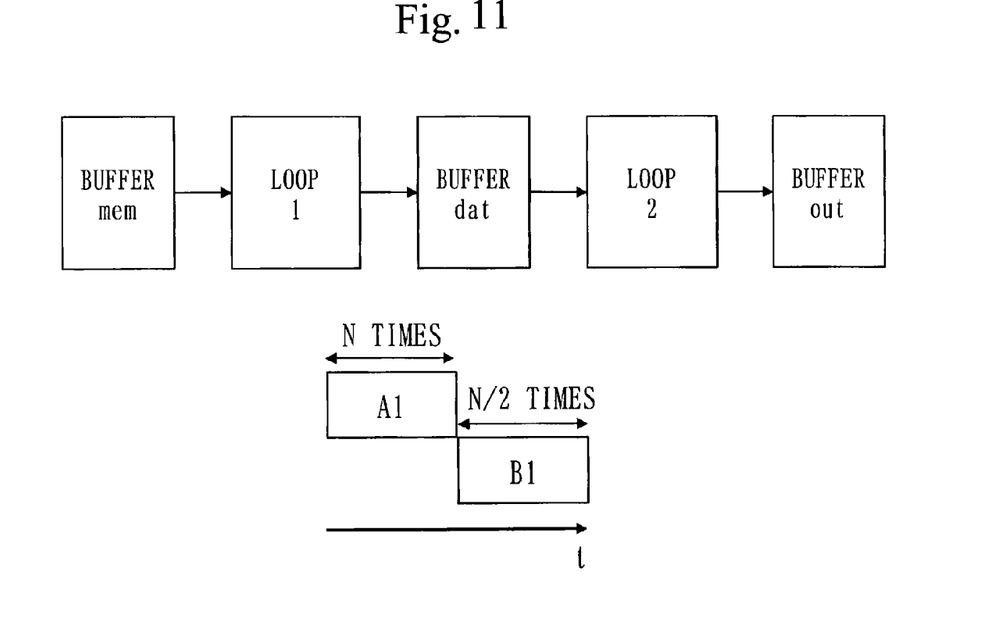
FIG. 11 shows an example of a block diagram and performance when a method of the first embodiment is not applied.

When the method of the present embodiment is not applied, if high level synthesis of the code of FIG. 8 is done to generate RTL, the generated RTL corresponds to a block diagram and performance shown in FIG. 11.

N buffers are necessary, and the processing of the second loop (B1 in FIG. 11) is started after finishing the processing of the first loop (A1 in FIG. 11).

Figure 12:
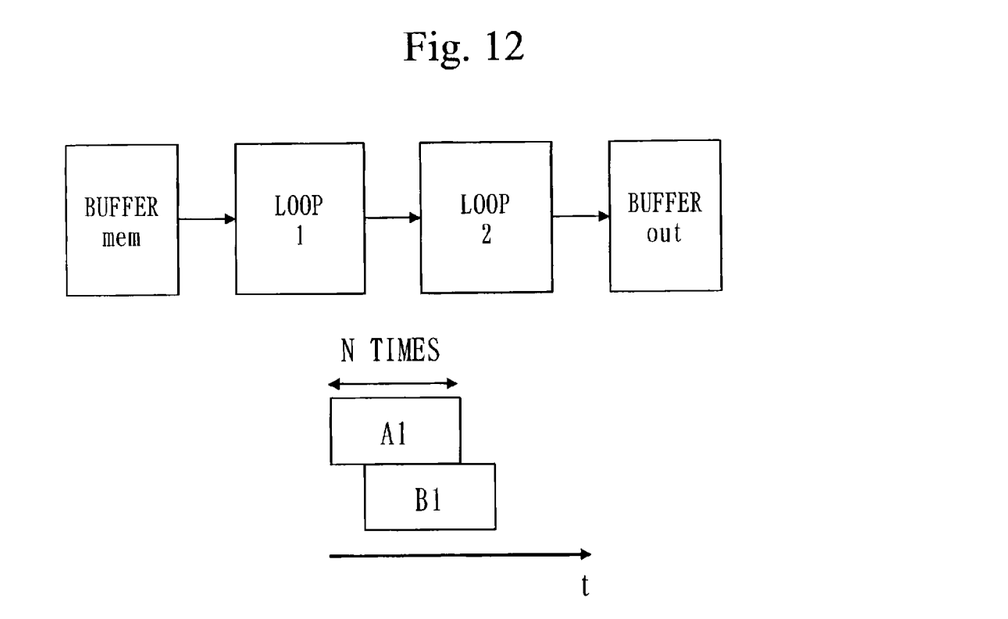
FIG. 12 shows an example of a block diagram and performance when the method of the first embodiment is applied (write-dependency: absent, read-dependency: present)

When the method of the present embodiment is applied to change the order of write accesses, and the high level synthesis of the code of FIG. 8 is done to generate RTL, the generated RTL corresponds to a block diagram and performance shown in FIG. 12.

According to the present embodiment, an intermediate buffer is unnecessary as shown in FIG. 12, the processing of the second loop (B1 in FIG. 12) can be started without waiting for the processing of the first loop (A1 in FIG. 12) to end, and thus high-speed processing can be done.

Access Case 3: As for "write dependency: absent" and "read dependency: absent", a processing with write dependency and without read dependency (Access Case 4) and a processing without write dependency and with read dependency (Access Case 2) are both carried out and either one with less access cost can be chosen between these two processings after processing these two cases.

Access Case 4: As for "write dependency: present" and "read dependency: absent", the order of read accesses is changed so as to reduce the access cost.

The example of code of FIG. 3 corresponds to Access Case 4.

Figure 10:
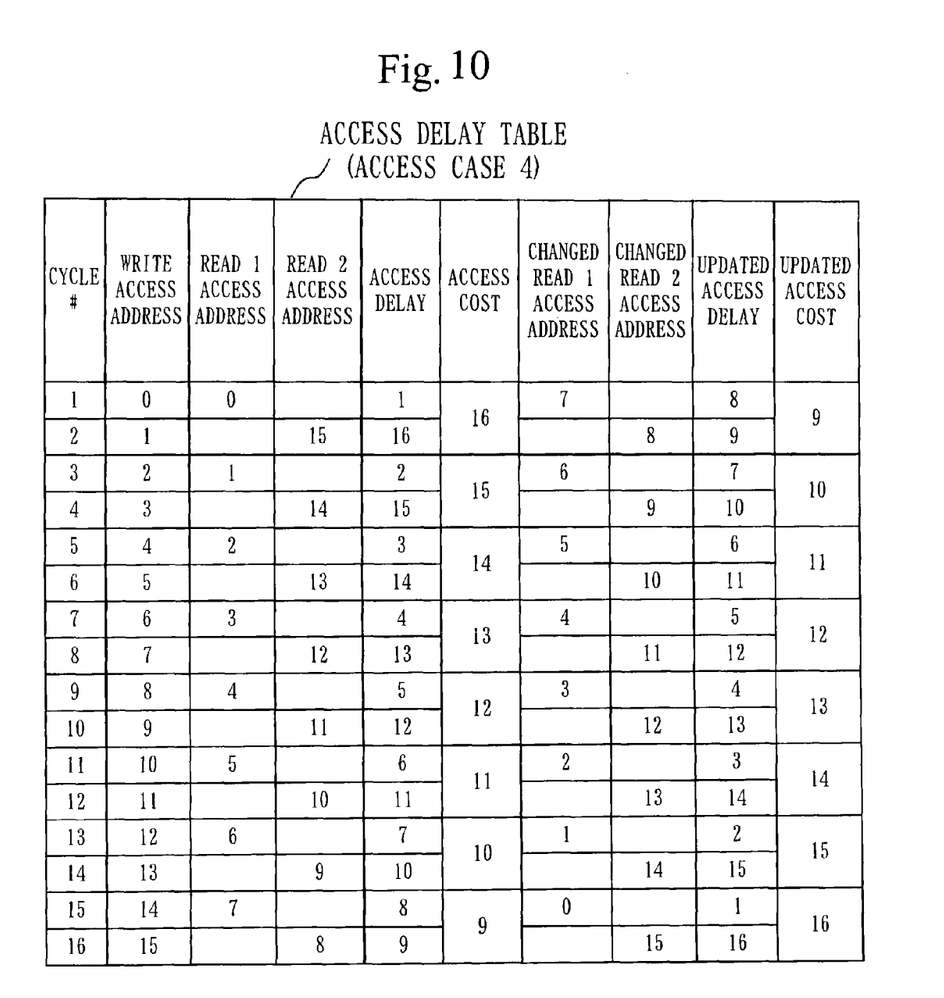
FIG. 10 shows an example of an access delay table (write-dependency: present, read-dependency: absent) related to the first embodiment.

FIG. 10 is a delay table showing changed order of accesses in case of the code of FIG. 3.

When the code in FIG. 3 is executed, the processing part 3, for example, changes the order of read access addresses according to the following algorithm.

First, the processing part 3 groups two read access addresses which are used with synchronization when the code of FIG. 3 is executed to generate a group (a group is called as a "pair", hereinafter) of the read access addresses.

For example, since the read 1 access address 7 and the read 2 access address 8 are processed at the same time in the loop ID2, they become a pair.

Then, the processing part 3 defines as a reference read access address, a read access address having an address value identical to an address value of a write access address whose timing of use is later between two read access addresses of the pair, for each pair of the read access addresses. And, the processing part 3 defines as a reference read access address, the write access address having the identical address value to the reference read access address.

Further, the processing part 3 changes the order of using the read access addresses by a unit of a pair of the read access addresses so that the order of using the reference read access addresses should be matched with the order of using the reference write access addresses.

In the example of FIG. 7, (0,15), (1,14), (2,13), (3,12), (4,11), (5,10), (6,9), (7,8) of the read access addresses are made pairs.

Further, the read access addresses of (15, 14, 13, 12, 11, 10, 9, 8) become reference read access addresses.

In addition, the write access address having the same address value with the reference read access address become a reference write access address.

Then, the processing part 3 changes the order of using the read access address by a unit of a pair of the read access addresses so that the order of using the reference read access addresses should be matched with the order of using the reference write access addresses of (8, 9, 10, 11, 12,13,14, 15).

As a result, the order of the read access addresses is changed to the order of (7,8), (6,9), (5,10), (4,11), (3,12), (2,13), (1,14), and (0,15) as shown in FIG. 10.

The following shows a concept of the algorithm of changing the order of the read access addresses.

Since the order of using the write access address is fixed, the process which can be implemented first in the loop ID2 is the read access address 7 and the read access address 8 which can be processed directly after processing the write access address 7 and the write access address 8.

Therefore, a pair of the read access address 7 and the read access address 8 is assumed to be the first target of the read access.

In this case, it is possible to access the read access address 7 at the time of cycle 8 when the write access address 7 is accessed, so that the access delay of the read access address 7 is 8.

Further, it is possible to access the read access address 8 at the time of cycle 9 when the write access address 8 is accessed, so that the access delay of the read access address 8 is 9.

As a result of this, the access delay of the pair of the read access address 7 and the read access address 8 is 9.

Namely, at the time of the $9^{th}$ cycle, since both values of the read access address 7 and the read access address 8 are available, out[7]=dat[7]+dat[15−7] in the loop ID2 can be executed.

For the other pairs, since both data are not available, the processing cannot be started.

In the next cycle, the write access address 9 is accessed, since the write access address 6 is already done in the cycle 7, at the time of cycle 10, the read access address 6 and the read access address 9 become able to be operated.

In this way, the order of processing the read access addresses is changed, so that the operation is processed sequentially from the process which becomes able to be operated.

When the order of the read access addresses is changed to the order shown in FIG. 10, the sentence of out[0]=dat[0]+dat[15−0] using the read access address 0 and the read access address 15, which is the final pair, can be implemented in the $16^{th}$ cycle.

Therefore, the processing time can be largely reduced compared with 23 (FIG. 7) which is the cycle number of the case when the behavior description code of FIG. 3 is made a target of the high level synthesis without any change.

Further, in case of the order of FIG. 10, since the read from the read access addresses 8 to 15 is done directly after the write to the write access addresses 8 to 15, no buffer is necessary for the read access addresses 8 to 15, and eight buffers are required for the read access addresses 0 to 7 (this minimizes the number of buffers).

Therefore, it is possible to largely reduce the number of buffers compared with 16 which is the number of buffers which are required when the behavior description code of FIG. 3 is made a target of the high level synthesis without any change.

In this way, the order of the read access addresses is changed and the delay cost becomes small, the delay of the data output from the loop ID2 becomes small, and as a result, low latency processing can be implemented.

Namely, when the method of the present embodiment is not applied, N registers or memories whose number is identical to the number of pieces of data are necessary; however, the order of access is changed according to the present embodiment, thereby reducing the number of buffers to a half.

Further, when the method of the present embodiment is not applied, the processing of the loop ID2 can be started after the $16^{th}$ cycle. The order of access is changed according to the present embodiment, so that the processing of the loop ID2 can be started after the $8^{th}$ cycle, thereby implementing the low latency processing.

The capacity of buffer is reduced to a half, and further, the calculation of the loop 2 can be started while the calculation of the loop 1 is carried out, and thereby high-speed processing can be done.

Figure 13:
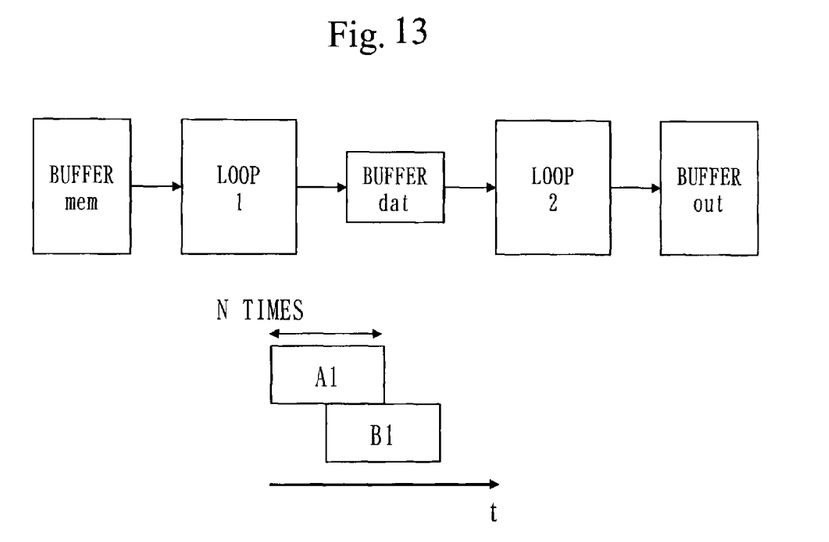
FIG. 13 shows an example of a block diagram and performance when the method of the first embodiment is applied (write-dependency: present, read-dependency: absent)

FIG. 13 shows a block diagram of Access Case 4 and its performance.

As shown in FIG. 13, the size of the intermediate buffer is small when compared with FIG. 11, and the processing of the second loop (expressed as B1 in FIG. 13) can start without waiting for the processing of the first loop (expressed as A1 in FIG. 13) to end, so that the processing can be done in a high-speed.

As has been explained above, in either case of Access Case 2 or Access Case 4, the order of the write access or the read access is derived, which enables the number of buffers which will be generated by the high level synthesis to decrease, compared with the case in which the behavior description code is used directly for the high level synthesis. The order of using the write access addresses or the read access addresses is changed according to the derived order of the write access or the read access.

Then, finally the processing part 3 generates the code in which the order of accesses is changed, and the code in which the order of accesses is changed is stored in the file storage part 5 (at step ST7: GENERATE CODE).

The changed description part is determined by the number of lines described in the loop table (FIG. 6).

Here, the generation of code is done by developing the loop based on the access delay table (FIG. 9 or FIG. 10) so that the access should be done in the updated order of accesses.

Namely, the processing part 3 rewrites the description of the first loop sentence of FIG. 8 to the description in which the write access should be done in the order of the changed write access of FIG. 9.

Further, the processing part 3 rewrites the description of the second loop sentence of FIG. 3 to the description in which the read access should be done in the order of changed read access addresses of FIG. 10.

Here, instead of rewriting the behavior description code by the processing part 3, the processing part 3 can output information (example of information of order of using the write access addresses) showing the contents of the changed write access of FIG. 9 to the high level synthesizing device 2 (an example of a code rewriting device), and the high level synthesizing device 2 can rewrite the first loop of the code of FIG. 8 to the description in which the write access is done in the order of changed write accesses of FIG. 9.

Similarly, the processing part 3 can output information (example of information of order of using the read access addresses) showing the contents of the changed read access addresses of FIG. 10 to the high level synthesizing device 2 (an example of the code rewriting device), and the high level synthesizing device 2 can rewrite the second loop of the code of FIG. 3 to the description in which the read access is done in the order of changed read access addresses of FIG. 10.

As discussed above, the present embodiment has been explained the semiconductor design support device.

The semiconductor design support device includes the processing part inputting the behavior description which describes the behavior of the design circuit which is a target of the high level synthesis, extracting the dependency relationship between a plurality of array variables from the inputted behavior description, and generating a code by which the order of write access or read access to the array is changed so as to reduce the number of memories or registers implementing the array or to decrease the delay.

At the final section, an example of the hardware configuration of the semiconductor design support device 1 will be explained by referring to FIG. 14.

The semiconductor design support device 1 is a computer, and each element of the semiconductor design support device 1 is implemented by executing processes by pro grams.

As for the hardware configuration of the semiconductor design support device 1, an operation device 901, an external memory 902, a main memory 903, a communication device 904, and an input/output device 905 are connected to buses.

The operation device 901 is a CPU (Central Processing Unit) which executes programs.

The external memory 902 is, for example, a ROM (Read Only Memory), a flash memory, and a hard disk drive.

The main memory 903 is a RAM (Random Access Memory).

The communication device 904 carries out communication with the high level synthesizing device 2 and other devices.

The input/output device 905 is, for example, a mouse, a keyboard, a display device.

The programs are usually stored in the external memory 902, in a status of being loaded to the main memory 903, read sequentially and executed by the operation device 901.

The programs are to implement a function which has been explained as "the processing part 3" shown in FIG. 1.

Further, the external memory 902 also stores an operating system (OS), at least a part of the OS is loaded to the main memory 903, while executing the OS, the operation device 901 executes the programs to implement the function of "the processing part 3".

Further, information, data, signal values, variables showing the result of "determination of—", "extraction of—", "calculation of—", "derivation of—", "analysis of—", "detection of—", "set of—", "registration of—", "selection of—", "generation of—", "input of—", "output of—" and so on are stored in the main memory 903 as files.

Further, an encryption/decryption key, a random number, or a parameter can be stored in the main memory 903 as files.

Figure 14:
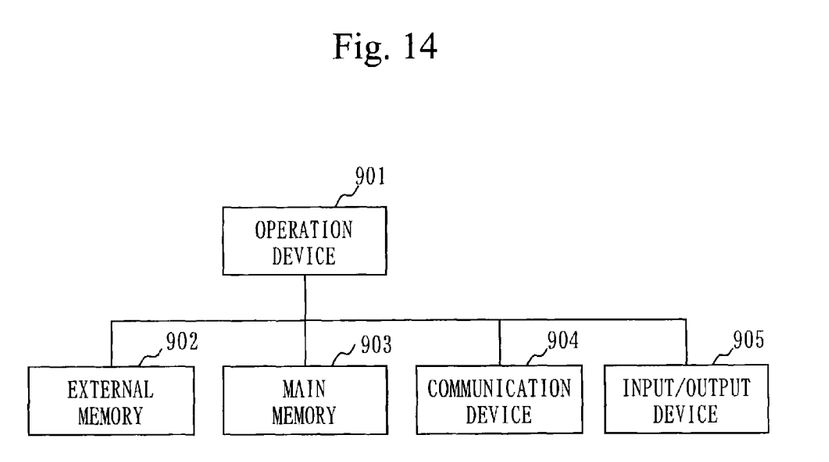
FIG. 14 shows an example of hardware configuration of the semiconductor design support device related to the first embodiment.

Here, the configuration of FIG. 14 shows merely an example of the hardware configuration; the hardware configuration of the semiconductor design support device 1 is not limited to the configuration shown in FIG. 14, but can be another configuration.

Further, the high level synthesizing device 2 of the present embodiment can also be configured like the hardware configuration of FIG. 14, but can be another configuration.

Further, a method of supporting the circuit design related to the present invention can be implemented according to the procedure which has been shown in the present embodiment.

REFERENCE SIGNS LIST

1: semiconductor design support device; 2: high level synthesis device; 3: processing part; 4: table storage part; and 5: file storage part.

Numerous additional modifications and variations are possible in light of the above teachings. It is therefore to be understood that, within the scope of the appended claims, the disclosure of this patent specification may be practiced otherwise than as specifically described herein.

The invention claimed is:

1. A circuit design support device comprising:
a code inputting unit that inputs a behavior description code which describe behavior of a circuit which is a target of high level synthesis using a write access array identifying a plurality of write access addresses to be accessed to write to a memory array in the circuit and a read access array identifying a plurality of read access addresses to be accessed to read from a memory array in the circuit;

an access order determining unit that analyzes the behavior description code, and determines an order of using write access addresses in the plurality of write access addresses when the behavior description code is executed and an order of using read access addresses in the plurality of read access addresses when the behavior description code is executed; and an access order changing unit that performs either one of a write access order changing process to change the order of using the write access addresses to write to the memory array in the circuit when the behavior description code is executed based on the order of using the read access addresses determined by the access order determining unit, and a read access order changing process to change the order of using the read access addresses to read from the memory array in the circuit when the behavior description code is executed based on the order of using the write access addresses determined by the access order determining unit, wherein the high level synthesis generates buffers based on timings of use of a write access address and a read access address having common address values, and the access order changing unit derives an order of using the write access addresses or the read access addresses by which a number of the buffers generated by the high level synthesis is decreased.

2. The circuit design support device according to claim 1, wherein the access order changing unit:

determines whether or not the behavior of the circuit which is the target for high level synthesis is changed if the order of using the write access addresses is changed, and whether or not the behavior of the circuit which is the target for high level synthesis is changed if the order of using the read access addresses is changed, and based on the determined result, performs either one of the write access order changing process and the read access order changing process.

3. The circuit design support device according to claim 2, wherein the access order changing unit performs:

the write access order changing process when the behavior of the circuit which is the target of high level synthesis is changed if the order of using the read access addresses is changed, while the behavior of the circuit which is the target for high level synthesis is not changed if the order of using the write access addresses is changed, the read access order changing process when the behavior of the circuit which is the target for high level synthesis is changed if the order of using the write access address is changed, while the behavior of the circuit which is the target for high level synthesis is not changed if the order of using the read access address is changed, and either one of the write access changing process and the read access changing process when the behavior of the circuit which is the target of high level synthesis is not changed even if any one of the order of using the write access addresses or the order of using the read access addresses is changed.

4. The circuit design support device according to claim 1, wherein the high level synthesis generates a buffer to absorb a difference between timings of use of a write access address and a read access address in a pair, if there is a difference between timings of use of the write access address and the read access address in a pair, for each of pairs of the write access address and the read access address having common address values, wherein the access order changing unit, in the write access order changing process, derives an order of using the write access addresses by which the number of buffers generated by the high level synthesis decreases compared with a case the behavior description code inputted by the code inputting unit is directly used for the high level synthesis, and changes the order of using the write access addresses in accordance with the order derived, and in the read access order changing process, derives an order of using the read access addresses by which the number of buffers generated by the high level synthesis decreases compared with the case the behavior description code inputted by the code inputting unit is directly used for the high level synthesis, and changes the order of using the read access address in accordance with the order derived.

5. The circuit design support device according to claim 4, wherein the access order changing unit, in the write access order changing process, without changing the order of using the read access addresses determined by the access order determining unit, derives an order of using the write access addresses by which the number of buffers generated by the high level synthesis decreases, and in the read access order changing process, without changing the order of using the write access addresses determined by the access order determining unit, derives the order of using the read access addresses by which the number of buffers generated by the high level synthesis decreases.

6. The circuit design support device according to claim 4, wherein the access order changing unit, in the write access order changing process, derives an order of using the write access addresses by which the number of buffers generated by the high level synthesis is minimized, and in the read access order changing process, derives an order of using the read access addresses by which the number of buffers generated by the high level synthesis is minimized.

7. The circuit design support device according to claim 1, wherein the access order changing unit, in the write access order changing process, changes the order of using the write access addresses so as to be matched with the order of using the read access addresses determined by the access order determining unit.

8. The circuit design support device according to claim 1, wherein the access order changing unit, in the read access order changing process, groups two or more read access addresses which are used with synchronization when the behavior description code is executed, for each group of the read access addresses, among the two or more read access addresses in a group, defines as a reference read access address, a read access address having an address value identical to an address value of a write access address whose timing of use is the latest, and also defines as a reference write access address, the write access address having the address value identical to the address value of the reference read access address, and changes the order of using the read access addresses by a unit of group of the read access addresses so that an order of using the reference read access addresses should be matched with an order of using the reference write access addresses.

9. The circuit design support device according to claim 1,
wherein the access order determining unit extracts a plurality of loop sentences from the behavior description code, extracts a write access array and a read access array having a common array name, pairs the write access array and the read access array having the common array name, for each pair of the write access array and the read access array, determines an order of using the write access addresses and an order of using the read access addresses, and
wherein the access order changing unit, for each pair of the write access array and the read access array, performs either one of the write access order changing process and the read access order changing process.

10. The circuit design support device according to claim 1,
wherein the access order changing unit,
in the write access order changing process, changes the order of using the write access addresses by rewriting the behavior description code, and
in the read access order changing process, changes the order of using the read access addresses by rewriting the behavior description code.

11. The circuit design support device according to claim 1,
wherein the access order changing unit,
in the write access order changing process, outputs information of order of using the write access addresses showing the changed order of using the write access addresses to a code rewriting device which rewrites the behavior description code, makes the code rewriting device rewrite the behavior description code along the order of using the write access addresses shown by the information of order of using the write access addresses to change the order of using the write access addresses, and
in the read access order changing process, outputs information of order of using the read access addresses showing the changed order of using the read access addresses to the code rewriting device which rewrites the behavior description code, makes the code rewriting device rewrite the behavior description code along the order of using the read access addresses shown by the information of order of using the read access addresses to change the order of using the read access addresses.

12. A method for supporting a circuit design comprising:
by a computer, inputting a behavior description code which describes behavior of a circuit which is a target of high level synthesis using a write access array identifying a plurality of write access addresses to be accessed to write to a memory array in the circuit and a read access array identifying a plurality of read access addresses to be accessed to read from a memory array in the circuit;
by the computer, analyzing the behavior description code, and determining an order of using write access addresses in the plurality of write access addresses when the behavior description code is executed and an order of using read access addresses in the plurality of read access addresses when the behavior description code is executed; and
by the computer, performing either one of a write access order changing process to change the order of using the write access addresses to write to the memory array in the circuit when the behavior description code is executed based on the order of using the read access addresses determined, and a read access order changing process to change the order of using the read access addresses to read from the memory array in the circuit when the behavior description code is executed based on the order of using the write access addresses determined,
wherein the high level synthesis generates buffers based on timings of use of a write access address and a read access address having common address values, and the write access order changing process or the read access order changing process derives an order of using the write access addresses or the read access addresses, respectively, by which a number of the buffers generated by the high level synthesis is decreased.

13. A nontransitory computer readable medium storing a program causing a computer to execute the circuit design support method of claim 12.

14. A circuit design support device comprising:
a code inputting unit that inputs a behavior description code which describe behavior of a circuit which is a target of high level synthesis using a write access array to be accessed to write and a read access array to be accessed to read;
an access order determining unit that analyzes the behavior description code, and determines an order of using each write access address when the behavior description code is executed and an order of using each read access address when the behavior description code is executed; and
an access order changing unit that performs either one of a write access order changing process to change the order of using the write access addresses when the behavior description code is executed based on the order of using the read access addresses determined by the access order determining unit, and a read access order changing process to change the order of using the read access addresses when the behavior description code is executed based on the order of using the write access addresses determined by the access order determining unit,
wherein the access order changing unit,
in the write access order changing process, outputs information of order of using the write access addresses showing the changed order of using the write access addresses to a code rewriting device which rewrites the behavior description code, makes the code rewriting device rewrite the behavior description code along the order of using the write access addresses shown by the information of order of using the write access addresses to change the order of using the write access addresses, and
in the read access order changing process, outputs information of order of using the read access addresses showing the changed order of using the read access addresses to the code rewriting device which rewrites the behavior description code, makes the code rewriting device rewrite the behavior description code along the order of using the read access addresses shown by the information of order of using the read access addresses to change the order of using the read access addresses.

* * * * *